United States Patent [19]

Bottacchi et al.

[11] Patent Number: 4,799,224
[45] Date of Patent: Jan. 17, 1989

[54] DRIVER FOR A SEMICONDUCTOR LASER

[75] Inventors: Stefano Bottacchi, Milan; Mauro Oselladore, Trieste, both of Italy

[73] Assignee: GTE Telecomunicazioni, S.p.A., Cassina de Pecchi, Italy

[21] Appl. No.: 927,621

[22] Filed: Nov. 6, 1986

[30] Foreign Application Priority Data

Dec. 10, 1985 [IT] Italy .................. 23160 A/85

[51] Int. Cl.[4] .......................... H01S 3/00; H01S 3/13
[52] U.S. Cl. ........................................ 372/38; 372/26; 372/29; 372/31; 372/33; 307/311
[58] Field of Search .................. 372/38, 29, 26, 33, 372/31; 307/311

[56] References Cited

U.S. PATENT DOCUMENTS

| 4,410,810 | 10/1983 | Christen | 307/311 |
|---|---|---|---|
| 4,539,686 | 9/1985 | Bosch et al. | 372/26 |
| 4,568,838 | 2/1986 | Honda et al. | 307/311 |
| 4,594,717 | 6/1986 | Bracht et al. | 372/38 |
| 4,639,924 | 1/1987 | Tsunekawa | 372/33 |
| 4,709,370 | 11/1987 | Bednarz et al. | 372/38 |

OTHER PUBLICATIONS

P. W. Shumate & M. DiDomenico, Jr.; "Lightwave Transmitters"; Semiconductor Devices in Optical Communications; H. Kressel Editor; p. 184.

G. Arnold, P. Russer & K. Petermann; "Modulation of Laser Diodes"; Semiconductor Devices in Optical Communications; H. Kressel Editor; pp. 230-232.

M. J. Teare & L. W. Ulbricht; "Fiber Optic Transmitters and Receivers: Technology in Transfer"; Mar. 1985, GTE Labs Profile, pp. 19-24.

Primary Examiner—William L. Sikes
Assistant Examiner—Georgia Y. Epps
Attorney, Agent, or Firm—David N. Caracappa

[57] ABSTRACT

The invention relates to a driver for a semiconductor laser which makes it possible to obtain a high switching rate as well as bias and modulation current control. These objects are achieved with an asymmetric mirror current generator and current variation means using one transistor only.

12 Claims, 1 Drawing Sheet

DRIVER FOR A SEMICONDUCTOR LASER

BACKGROUND OF THE INVENTION

This invention relates to the optical fiber signal transmission field and, in particular, to a driver for a semiconductor laser comprising a laser, a direct current generator and current variation means.

It is a known fact that optical communication systems comprise electrooptical transmission and reception modules directly connected to the optical fiber ends which, in practice, determine the correct transfer of information and the global performance of the system.

It is also known that an optical fiber signal transmission module consists essentially of a laser, a modulation circuit which modulates the electric signal to be sent to the laser, a thermal stabilization circuit and an automatic control circuit which controls the power emitted by the laser.

It is further known that semiconductor lasers consist essentially of a P-N junction whose "excitation current v. emitted power" characteristic is similar to the "voltage v. current" characteristic of a semiconductor diode where the P-N junction must be supplied with a certain current $I_L$ in order to obtain a certain emitted power $P_L$. This current $I_L$ is made up of a bias current $I_P$ which induces the P-N junction to work in the neighborhood of its threshold and to be ready to emit coherent light according to the laser characteristics, and of a modulation current $I_M$ which modulates the laser coherent light according to the information to be transmitted.

It is further known that temperature and aging affect the laser characteristic curve, so that in the same laser operation the knee of the curve may shift and the slope may change. It is obvious that even in the presence of such changes the laser must always emit the same power $P_L$ and it is therefore absolutely necessary to be able to change the bias current $I_P$ in order to compensate emission threshold variations and to regulate the modulation current $I_M$ in order to compensate emission efficiency losses.

It is finally known that a very important factor in the evaluation of a transmission module is its switching rate which, in practice, determines the transmission capacity and consequently the field of application of the whole optical communication system.

In a first known solution (see H. Kressel's book "Semiconductor devices for optical communication" pp. 230-232) the laser is powered by two current generators constructed with differential stages. A first generator, i.e. the bias current generator, supplies the laser with a constant current $I_P$ whilst a second generator, i.e. the modulation current generator, supplies the same laser with a variable current $I_M$. In the time intervals in which the laser must not emit any power, the only current circulating therein is the bias current $I_P$ whilst in the time intervals in which the laser must emit power the current circulating therein is a current $I_L$ obtained from the sum of the bias current $I_P$ plus the modulation current $I_M$.

This solution affords the advantage of allowing the regulation of both the bias current $I_P$ and the modulation current $I_M$ but also presents a variety of drawbacks. To begin with, it uses a large number of transistors involving high manufacturing costs. In addition, in order to be sure that differential stages with satisfactory characteristics are obtained, components with very narrow tolerance limits must be used since the two transistors making up the differential pair must be theoretically identical; this will further increase manufacturing costs and assembly times because of the additional checks of the component characteristics and the selection of components whose features must be as nearly identical as possible. Furthermore, the injection efficiency, i.e. the ratio between the current $I_L$ passing through the laser and the current absorbed by the modulator, ranges from 25% to 50% at the utmost, involving considerable waste. Finally, response times are rather high since both transistors of the modulation current $I_M$ generator must switch over so that, quite apart from other considerations, this solution may be rather critical for bit rates of 500 Mbit/s and above.

Other solutions were proposed in order to obtain higher bit rates ranging, for instance, from 500 Mbit/s to 1 Gbit/s. One of such solutions consists in connecting the laser in parallel with a current generator that generates a current $I_L$ which allows the laser to emit power, and with a switching device consisting of MESFET devices (see page 184 of the above-mentioned book). Although high switching rates may be obtained, this solution is practically unusable since it is impossible to keep the laser biased viewing that the current $I_L$ will either pass entirely into the laser when the switch is open or will not pass at all when the switch is closed; in addition, it is impossible to adjust the value of the current $I_L$ in such a way that the same laser-emitted power $P_L$ is always available.

Another proposed solution consists in using ECL gates (see article "Fiber optic transmitters and receivers" by M. J. Teare and L. W. Ulbricht published in the March 1985 issue of the GTE Laboratories Profile). Also this solution affords a high switching rate but the adjusting of the bias current $I_P$ and modulation current $I_M$ values so that the same laser-emitted power $P_L$ is always available is impossible.

The object of the invention is consequently that of overcoming the above drawbacks and of providing a driver for a semiconductor laser that affords a high switching rate and makes it possible, at the same time, to adjust bias current $I_P$ and modulation current $I_M$ values. Other objects include the obtaining of a very simple circuit with a high injection efficiency and which presents no particular problems regarding the choice of components.

SUMMARY OF THE INVENTION

In accordance with principles of the present invention, a driver for a semiconductor laser includes a bias current source coupled in series with the semiconductor laser, forming a junction between them. A modulating current source includes a single transistor having a main conduction path coupled between the junction and a source of reference potential and having a control electrode responsive to an information bearing signal.

Further objects and advantages of the invention will ensue from the following detailed description and from the enclosed drawings, given merely as an example, where

DESCRIPTION OF THE PREFERRED EMBODIMENTS

Figure 1:
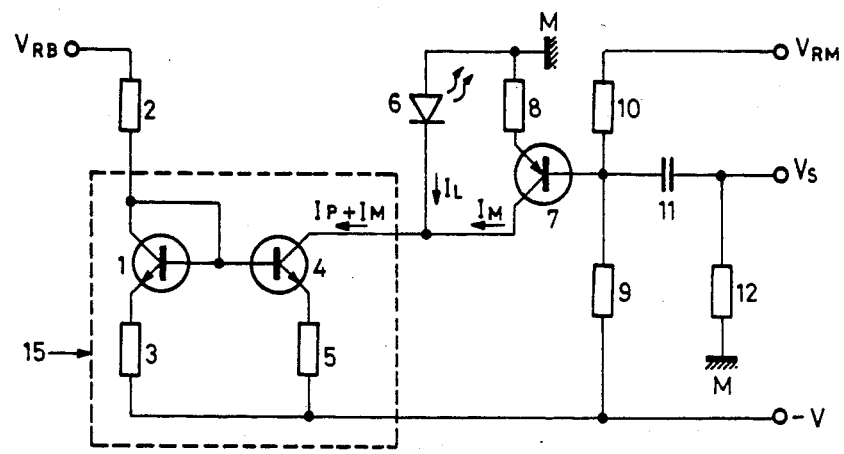
FIG. 1 shows a detailed circuit diagram of a first embodiment of the driver according to the invention.

With reference to FIG. 1 we note an NPN transistor 1 whose collector is connected to one end of a resistor 2 and whose emitter is connected to one end of a resistor 3. A variable direct voltage $V_{RB}$, whose function will be explained farther on, is applied to the other end of resistor 2 whilst the other end of resistor 3 is connected to a negative direct supply voltage $-V$. The base and collector of transistor 1 are connected with each other and with the base of an NPN transistor 4. The emitter of transistor 4 is connected to one end of a resistor 5 whose other end is connected to the supply voltage $-V$, whilst the collector of transistor 4 is connected to the cathode of a laser 6 and to the collector of a PNP transistor 7. The anode of laser 6 is connected to the circuit ground M whilst the emitter of transistor 7 is connected to one end of a resistor 8 whose other end is connected to ground M. The base of transistor 7 is connected to one end of a resistor 9 whose other end is connected to the supply voltage $-V$, and to one end of resistor 10, to whose other end is applied a variable direct voltage $V_{RM}$, whose function will be explained farther on. The junction point between resistors 9 and 10 is also connected to one end of a capacitor 11, whose other end is connected to one end of a resistor 12. The other end of resistor 12 is connected to the circuit ground M, whilst a modulating signal $V_s$ is applied to the junction point between capacitor 11 and resistor 12. NPN transistors are of the Philips BFR96 type and PNP transistors are of the Philips BFT93 type.

Transistors 1 and 4 are connected according to an asymmetric current mirror pattern and form a direct-current generator 15. Resistors 3 and 5 are sized in such a way that current generator 15 supplies a current intensity equal to the sum of the bias current $I_P$ plus the modulation current $I_M$ of laser 6. The modulating signal $V_s$ is applied via the decoupling capacitor 11 to the base of transistor 7. When transistor 7 is in a cutoff condition it forms an open circuit, the current $I_L = I_P + I_M$ circulates within laser 6 and the laser emits power. When transistor 7 is in a saturation condition, it forms a short circuit and part of the current is taken away from laser 6 and channelled into the branch in which transistor 7 is inserted. Resistor 8 is sized so that the current circulating in this branch is exactly the modulation current $I_M$. Under such conditions, the modulation current $I_M$ will circulate within the branch formed by resistor 8 and transistor 7 and a current equal to the bias current $I_P$ only will circulate within laser 6 which will no longer emit a significant amount of power.

Resistors 3 and 5 are sized in such a manner that almost all the current absorbed by current generator 15 will circulate within the branch formed by transistor 4 and resistor 5 and consequently within laser 6, whereby a high injection efficiency is obtained. In particular, if the ratio between resistor 3 and resistor 5 is 10, the injection efficiency will be 90%.

The variable direct voltage $V_{RB}$ is generated by an automatic control circuit not shown in the figure, as a function of the position of the laser 6 characteristic curve knee. Should this knee shift because of aging or because of a temperature variation, voltage $V_{RB}$ will change accordingly and cause the total generated current intensity to vary so that the current circulating in laser 6 will always be sufficient for the laser to work above its emission threshold.

The variable direct voltage $V_{RM}$ is generated by an automatic control circuit not shown in the figure, as a function of the slope of the laser 6 characteristic curve. Should this slope change because of a laser 6 emission efficiency loss or for any other reason, the voltage $V_{RM}$ will also change accordingly and cause the bias of transistor 7 and consequently the intensity of the modulation current $I_M$ circulating within this branch to vary so that the power emitted by laser 6 will always be constant.

Figure 2:
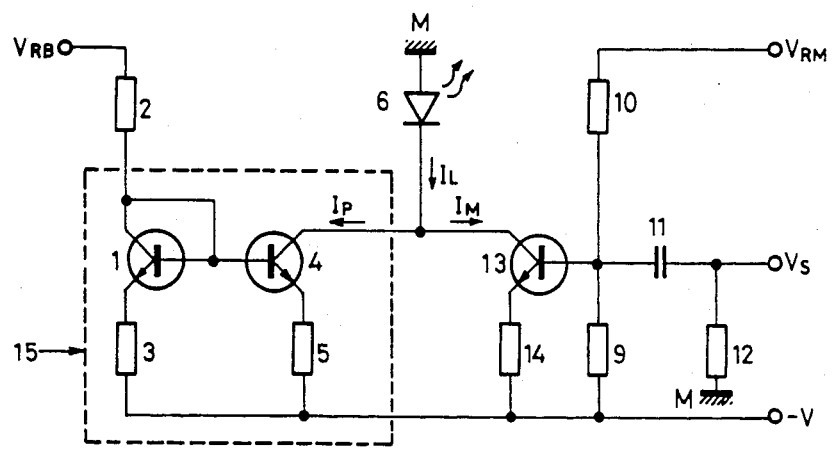
FIG. 2 shows a detailed circuit diagram of a second embodiment of the driver according to the invention.

FIG. 2, in which identical components appearing also in FIG. 1 are identified by the same number, differs from FIG. 1 in that the PNP transistor 7 is replaced by the NPN transistor 13. The collector of transistor 4 is connected to the collector of transistor 13 whose emitter is connected to one end of a resistor 14 whose other end is connected to the supply voltage $-V$.

In this second case resistors 3 and 5 are sized so that the current applied by current generator 15 is equal to the bias current $I_P$ of laser 6 whilst resistor 14 is sized so that the current supplied by transistor 13 is equal to the modulation current $I_M$ of laser 6. Also in this case the ratio between resistor 3 and resistor 5 is 10 so that the injection efficiency amounts to 90%. The modulating signal $V_s$ is applied via the decoupling capacitor 11 to the base of transistor 13. When transistor 13 is in a cutoff condition, it supplies no current whatsoever and a current $I_L$ equal to the bias current $I_P$ only will circulate within laser 6 which will not emit a significant amount of power. When transistor 13 is in a saturation condition, it supplies the modulation current $I_M$ which is added to the bias current $I_P$; the current circulating within laser 6 is consequently a current $I_L = I_P + I_M$ and laser 6 will emit power.

Also in this second solution the variable direct voltages $V_{RB}$ and $V_{RM}$ are used to regulate the bias current $I_P$ and the modulation current $I_M$ in the manner explained above. In addition, this second solution affords the possibility of a completely independent regulation of the bias current $I_P$ and of the modulation current $I_M$.

In both solutions illustrated above, the switch-over of one transistor only is sufficient to cause the transition from an emission of power condition to a non-emission of power condition in laser 6 and for this reason the driver is particularly fast. In fact, from measurements made in the lab, switching times range from $3 \times 10^{-10}$ sec to $5 \times 10^{-10}$ sec.

Resistor 12 is sized so as to adapt the modulating signal $V_s$ level to the level of the signal required to control transistor 7 or transistor 13 whilst the task of capacitor 11 is to stop my possible direct-current component which may be present in the circuit which generates the modulating signal $V_s$, as may be the case in circuits constructed with a ECL technique.

The advantages of the driver for a semiconductor laser according to the invention clearly appear from the above description. In particular, the main advantages are the very high switching rate of the driver, the possibility of ajusting the bias and modulation current values so as to compensate variations in the laser characteristic curve, the extreme simplicity of the circuit which uses only three transistors with a considerable saving in manufacturing costs, the possibility of using components that need no particular previous selection, which further reduces assembly costs.

Numerous variations of the driver for a semiconductor laser described herein merely as an example are obviously possible to those skilled in the art without stepping out of the framework of the intrinsic principle of novelty exhibited by the invention

We claim:

1. A driver circuit for a semiconductor laser comprising:
   a bias current source, coupled in series with said semiconductor laser forming a junction therebetween; and
   a modulating current source including a single transistor having a main conduction path coupled between said junction and a source of reference potential, said transistor further including a control electrode responsive to a modulating signal.

2. The driver circuit of claim 1, wherein said bias current source comprises a current mirror.

3. The driver circuit of claim 1, wherein said bias current source comprises an asymmetric current mirror.

4. The driver circuit of claim 1, wherein said bias current source comprises:
   a source of a bias current regulating signal;
   an input terminal coupled to said bias current regulating signal source;
   an output terminal coupled to said junction;
   a source of supply voltage;
   a second, diode connected, transistor having a main conduction path coupled between said input terminal and said source of supply voltage, and a control electrode; and
   a third transistor having a main conduction path coupled between said output terminal and said source of supply voltage, and a control electrode coupled to said control electrode of said second transistor.

5. The driver circuit of claim 4, wherein said bias current source further comprises:
   a first impedance coupled between said input terminal and said common node; and
   a second impedance coupled between said output terminal and said common node.

6. The driver circuit of claim 1, wherein said modulating signal is a bistate signal, and said modulating current source further comprises:
   a source of a modulating current regulating signal, and
   means for rendering said transistor conductive to pass a regulated current in response to said modulating signal having a first state, and for rendering said transistor nonconductive in response to said modulating signal having a second state.

7. The driver circuit of claims 6, wherein said rendering means comprises a current determining resistance coupled between said junction and said source of reference potential.

8. The driver circuit of claim 6, wherein said rendering means comprises a capacitor having a first electrode coupled to said control electrode of said transistor, and a second electrode responsive to said modulating signal.

9. The driver circuit of claim 6, wherein said main conduction path of said transistor is coupled in parallel with said semiconductor laser.

10. The driver circuit of claim 9, wherein said rendering means further comprises:
    a voltage divider having a first terminal coupled to said modulating current regulating signal source, a second terminal coupled to a source of operating potential, and an intermediate tap coupled to said control electrode of said transistor.

11. The driver circuit of claim 6, wherein said main conduction path of said transistor is coupled in parallel with said bias current source.

12. The driver circuit of claim 11, wherein said rendering means further comprises:
    a voltage divider having a first terminal coupled to said modulating current regulating signal source, a second terminal coupled to said source of reference potential, and an intermediate tap coupled to said control electrode of said transistor.

* * * * *